United States Patent
Chen et al.

(10) Patent No.: US 9,627,031 B1
(45) Date of Patent: Apr. 18, 2017

(54) CONTROL METHODS AND MEMORY SYSTEMS USING THE SAME

(71) Applicant: MediaTek Inc., Hsin-Chu (TW)

(72) Inventors: Kai-Hsin Chen, Changhua (TW); Shih-Hsiu Lin, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/067,377

(22) Filed: Mar. 11, 2016

(51) Int. Cl.
*G11C 7/00* (2006.01)
*G11C 11/4076* (2006.01)
*G11C 11/409* (2006.01)
*G11C 7/10* (2006.01)
*G11C 7/22* (2006.01)
*G11C 8/04* (2006.01)

(52) U.S. Cl.
CPC ........ *G11C 11/4076* (2013.01); *G11C 7/1006* (2013.01); *G11C 7/1045* (2013.01); *G11C 7/1051* (2013.01); *G11C 7/1078* (2013.01); *G11C 7/22* (2013.01); *G11C 7/227* (2013.01); *G11C 8/04* (2013.01); *G11C 11/409* (2013.01)

(58) Field of Classification Search
CPC ......... G11C 7/22; G11C 7/227; G11C 7/1051; G11C 7/1078; G11C 7/1045; G11C 7/1006; G11C 11/4076; G11C 11/409; G11C 8/04; G11C 29/027

USPC ....... 365/191, 193, 199, 189.12, 210.1, 201, 365/211

See application file for complete search history.

(56) References Cited

U.S. PATENT DOCUMENTS

| | | | | |
|---|---|---|---|---|
| 5,369,797 A | * | 11/1994 | Tyree | G04G 13/028 368/10 |
| 9,432,298 B1 | * | 8/2016 | Smith | H04L 49/9057 |
| 2009/0262929 A1 | * | 10/2009 | Walmsley | G06F 21/85 380/46 |
| 2011/0096930 A1 | * | 4/2011 | Walmsley | H04L 9/0662 380/278 |

* cited by examiner

*Primary Examiner* — Gene Auduong
(74) *Attorney, Agent, or Firm* — McClure, Qualey & Rodack, LLP (57) ABSTRACT

A control method for a memory system is provided. A memory controller of the memory system is configured to control the memory device. After a condition is met, the memory controller performs a retry operation to compensate for shifting of a data strobe signal sent from the memory device until the memory system enters a normal operation mode. When the shifting of the data strobe signal is compensated for, the number of pulses of the data strobe signal in the gating window is equal to the first predetermined number.

29 Claims, 10 Drawing Sheets

CONTROL METHODS AND MEMORY SYSTEMS USING THE SAME

BACKGROUND OF THE INVENTION

Field of the Invention

The invention relates to a control method, and, more particularly, to a control method for a memory system which is capable of compensating for shifting of a data strobe signal (DQS) sent from a memory device induced by voltage/temperature variation.

Description of the Related Art

In general, when voltage or temperature variation occurs on a memory system, shifting of a data strobe signal (DQS) sent from a memory device is induced. The data strobe signal is used for latching data in response to read commands. If the data strobe signal is shifted, the memory system cannot read correct data from the memory device. Thus, how to minimize the effect on the read operation caused by the shifting of the data strobe signal is an important issue for memory systems.

BRIEF SUMMARY OF THE INVENTION

An exemplary embodiment of a control method for a memory system is provided. The control method comprises: after a condition is met, performing a retry operation until the memory system enters a normal operation mode. The retry operation comprises the steps of defining a predetermined gating window having an initial starting time point; performing a first dummy read operation on a memory device of the memory system by sending at least one first read command to the memory device and generating a data strobe signal by the memory device in response to the at least one first read command; determining whether a number of pulses of the data strobe signal in the gating window having the initial starting time point is equal to a first predetermined number; and when it is determined that the number of pulses of the data strobe signal in the gating window having the initial starting time point is not equal to the first predetermined number, shifting the gating window by moving a starting time point of the gating window from the initial starting time point to a first shifted starting time point.

An exemplary embodiment of a memory system is provided. Comprises a memory device and a memory controller. The memory controller is coupled to the memory device and configured to control the memory device. After a condition is met, the memory controller performs a retry operation to compensate for shifting of a data strobe signal sent from the memory device until the memory system enters a normal operation mode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
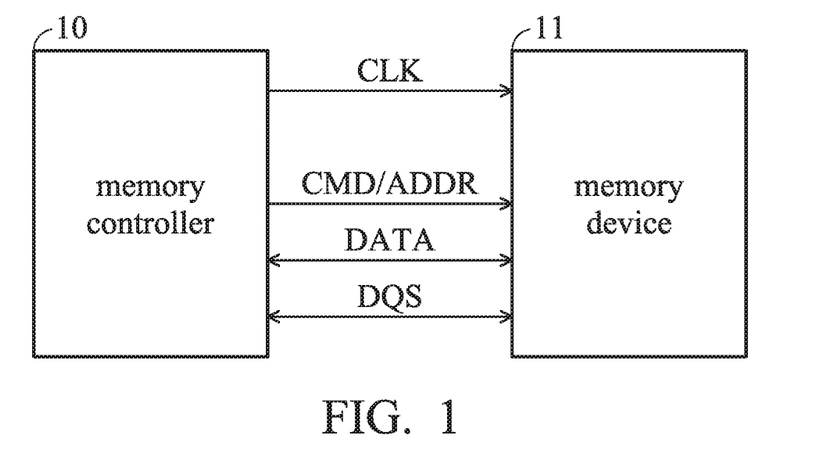
FIG. 1 shows one exemplary embodiment of a memory system.

FIG. 1 shows an exemplary embodiment of a memory system. As shown in FIG. 1, a memory system 1 comprises a memory controller 10 and a memory device 11. In the embodiment, the memory device 11 is a dynamic random access memory (DRAM). There are signals or data transmitted between the memory controller 10 and the memory device 11. For example, the memory controller 10 provides a clock signal CLK to the memory device 11 to serve as a basic clock for data/signal receiving and transmitting. A signal CMD/ADDR sent from the memory controller 10 is used to notify the memory device that a read or write operation will be performed on the memory device 10 and to indicate the positions of the data which will be accessed (read or written). Data strobe signals DQS and data DATA are transmitted between the memory controller 10 and the memory device 11 in bi-direction. For example, when a read command is sent to the memory device 11 through the signal CMD/ADDR, the memory device 11 will send a data strobe signal DQS and the corresponding data DATA in response to the received read command during the read operation. For a write command, the transmission direction of the data strobe signal DQS and the data DATA during a write operation is inverse to the transmission direction of the read operation.

The memory system 1 may operate in different modes, such as a normal operation mode, a suspend mode, a frequency scaling mode, etc. At the normal operation mode, the memory system 1 performs normal operations related to data reading and writing. When the memory system 1 operates at the suspend mode, the operation frequency is lowered to 0 Hz. At this time, the memory system 1 is at a self-refresh state or a deep power down state. When the memory system 1 operates at the frequency scaling mode, the operation frequency of the memory system 1 changes from the original frequency to a higher or lower frequency. That is, the memory system 1 is a memory system which adopts dynamic voltage and frequency scaling (DVFS) for power-management technique. In the following, the variation of the environment temperature is given as an example for illustration.

Figure 2:
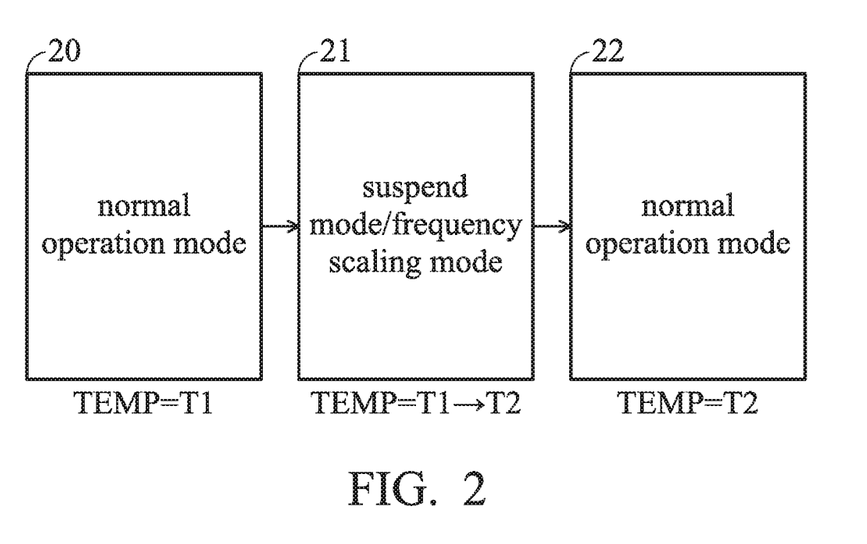
FIG. 2 is a diagram showing different modes of a memory system.
Figure 3A:
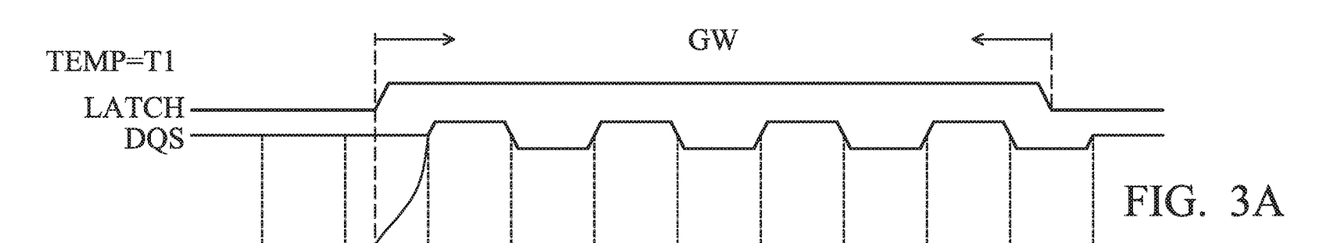
FIGS. 3A and 3B are diagrams showing a latch signal and a data strobe signal in different environment temperatures.

During the switching of the modes of the memory system 1, the environment temperature or operation voltage of the memory system 1 may vary. The variation in the environment temperature or operation voltage may occur shifting of important signals in the time line, which causes the memory system 1 to incorrectly perform a read/write operation. For example, as shown in FIG. 2, the memory system 1 operates at the normal operation mode (Block 20) first when the environment temperature TEMP at that time is T1 (TEMP=T1). During the normal operation mode at the environment temperature T1 (Block 20), when the memory controller 10 sends a read command to the memory device 11 through the signal CMD/ADDR, the memory device 11 sends a data strobe signal DQS to the memory controller 10 in response to the received read command. At this time, the memory controller 10 generates a latch signal LATCH with a gating window GW in response to the read command, as shown in FIG. 3A. The gating window GW has a fixed time length. The pulses of the data strobe signal DQS in the gating window GW are used to latch data DATA from the memory device 11. The gating window GW has a starting time point STP30. The starting time point STP30 occurs after the read command is sent to the memory device 11. In other words, the starting time point STP30 occurs after the read latency related to the read command which depends on the response time of the memory system 1. For example, according to the design and requirement of the memory system 1, there are four pulses of the data strobe signal DQS after the starting time point STP30, including four rising edges and four falling edges. When all of the four pulses of the data strobe signal DQS occurs in the gating window GW for each read command, the corresponding read operation is successful.

Figure 3B:
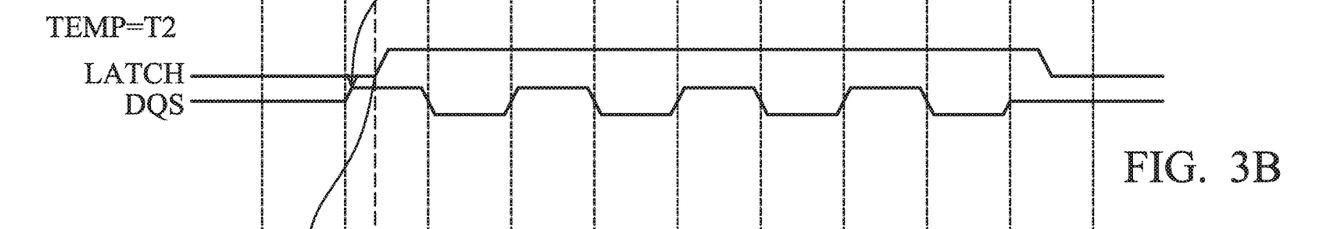

Then, the memory system 1 is switched to operate at the suspend mode or frequency scaling mode (Block 21). During the suspend mode or frequency scaling mode, the environment temperature TEMP varies from T1 to T2 (TEMP=T1→T2). After the memory system 1 is switched back to operate at the normal operation mode (Block 22) from the suspend mode or frequency scaling mode (Block 21), the environment temperature environment temperature TEMP may be still at T2. During the normal operation mode at environment temperature T2 (Block 22), when the memory controller 10 sends a read command to the memory device 11 through the signal CMD/ADDR. The memory device 11 sends a data strobe signal DQS to the memory controller 10 in response to the received read command. In this case, the data strobe signal DQS which is sent from the memory device 11 in response to a read command is shifted due to the variation of the environment temperature TEMP. As shown in FIG. 3B, the data strobe signal DQS is shifted backward in the time line. However, the gating window GW of the latch signal LATCH is not shortened or lengthened. Thus, the memory controller 11 cannot latch four pulses of the received data strobe signal DQS in the gating window GW. In the detailed description, referring to FIG. 3B, there are only three rising edges and four falling edges, which does not conform with the design and requirement of the memory system 1. Accordingly, the memory controller 10 does not perform the read operation normally to read correct the data from the memory device 11.

Figure 4:
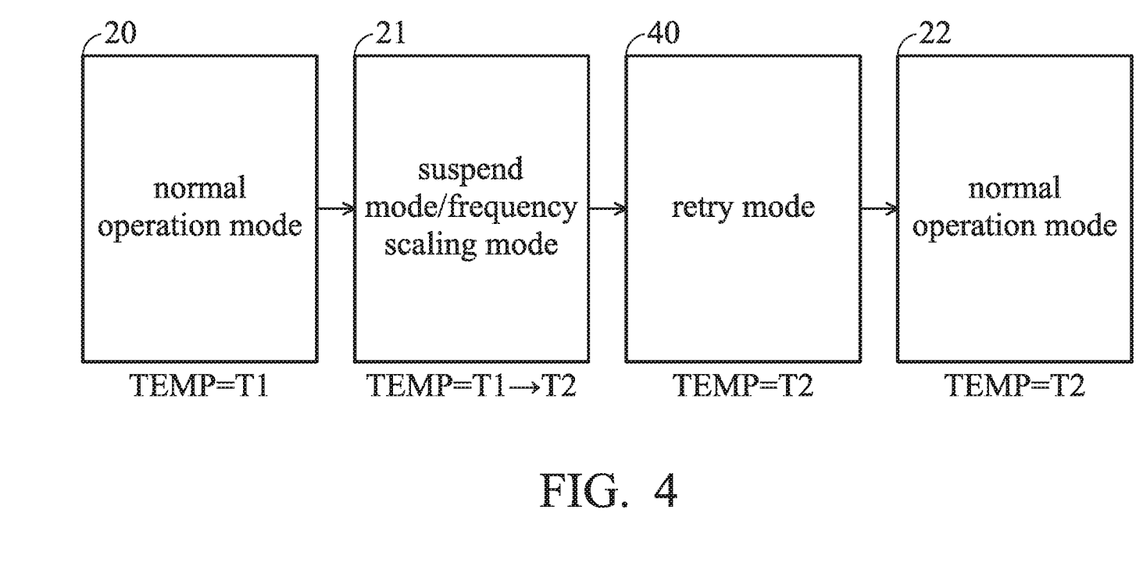
FIG. 4 is a diagram showing different modes and mode switching of a memory system according to an exemplary embodiment.
Figure 5A:
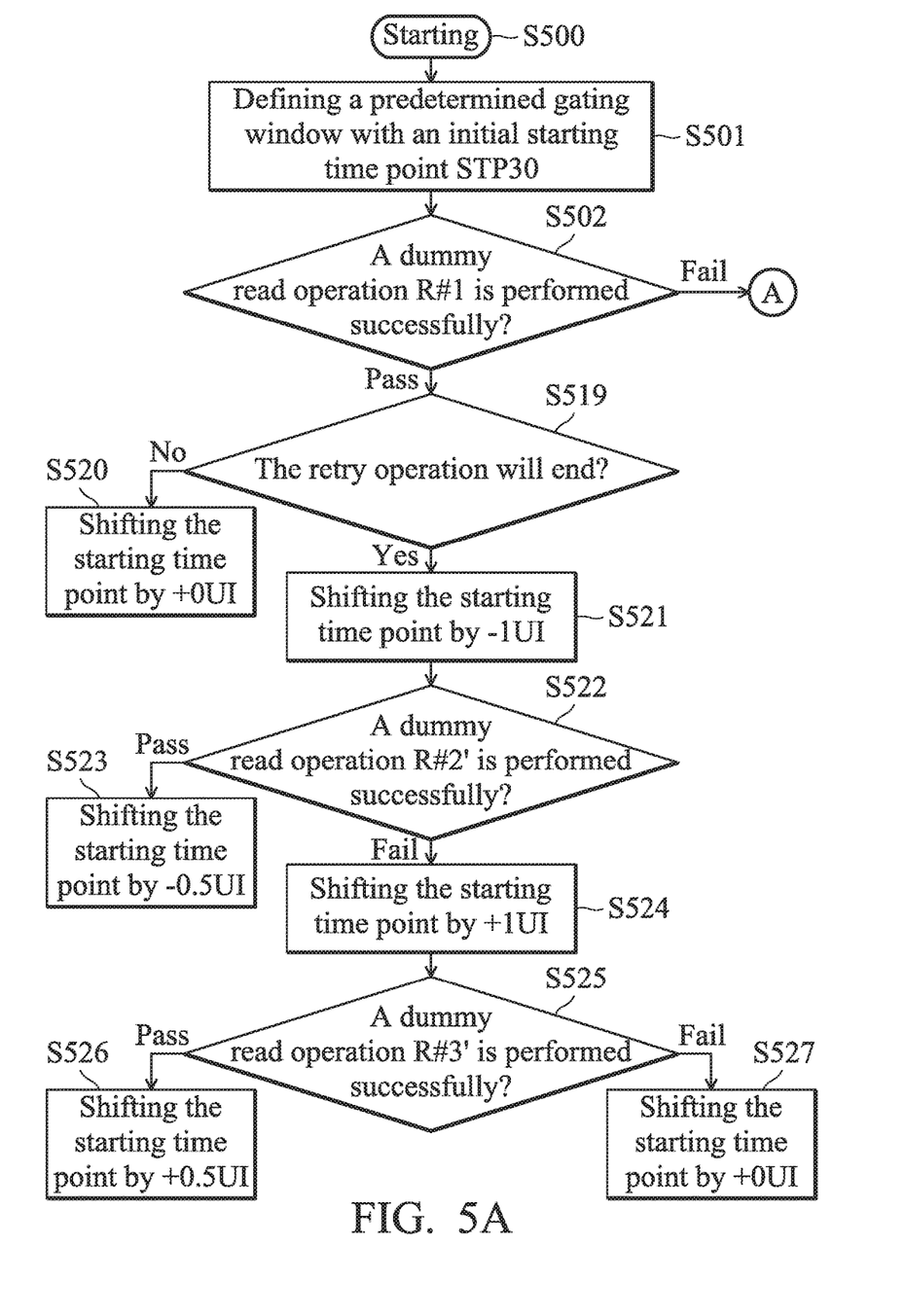
FIGS. 5A-5C show a flow chart of one exemplary embodiment of a control method for a memory system.
Figure 5B:
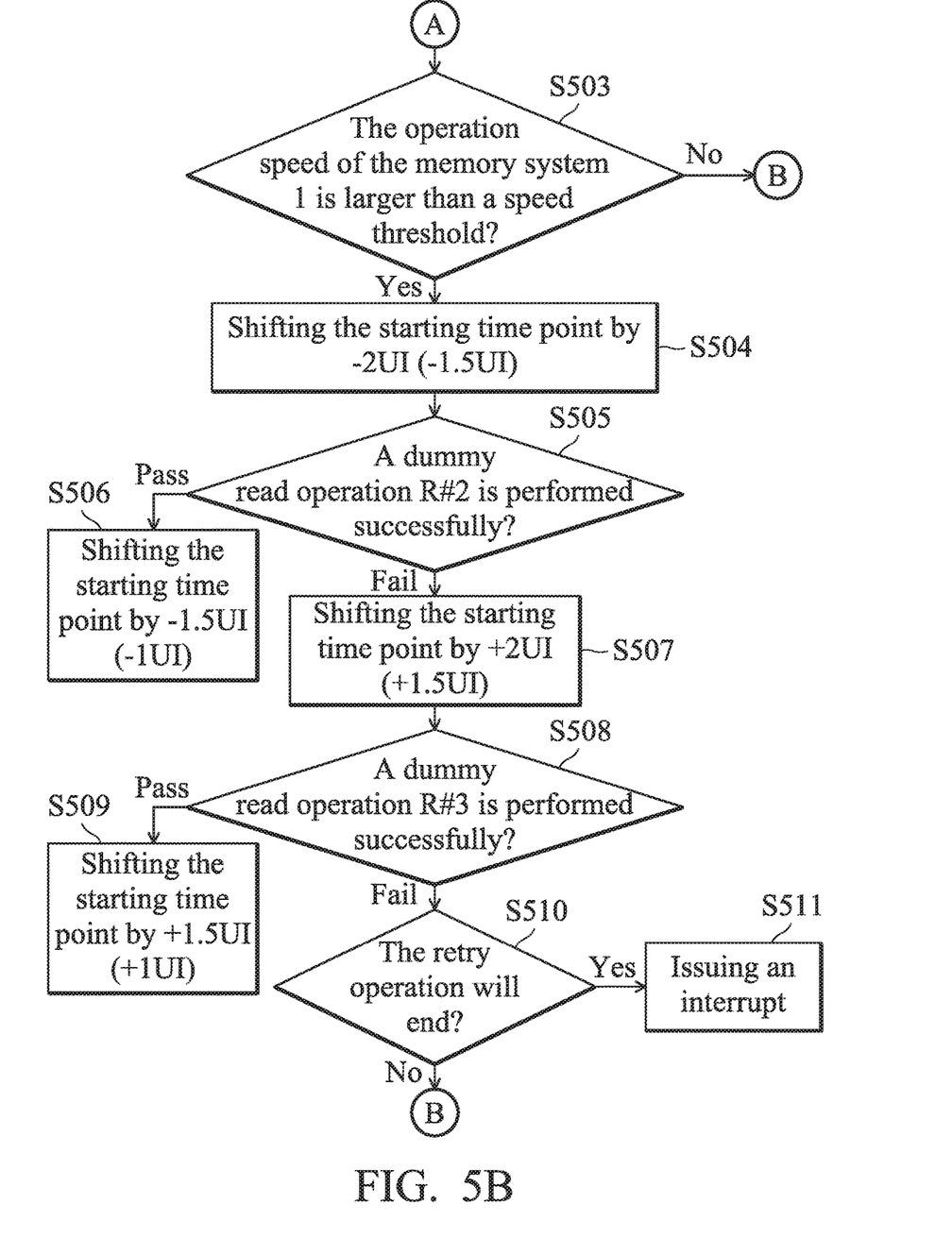
Figure 5C:
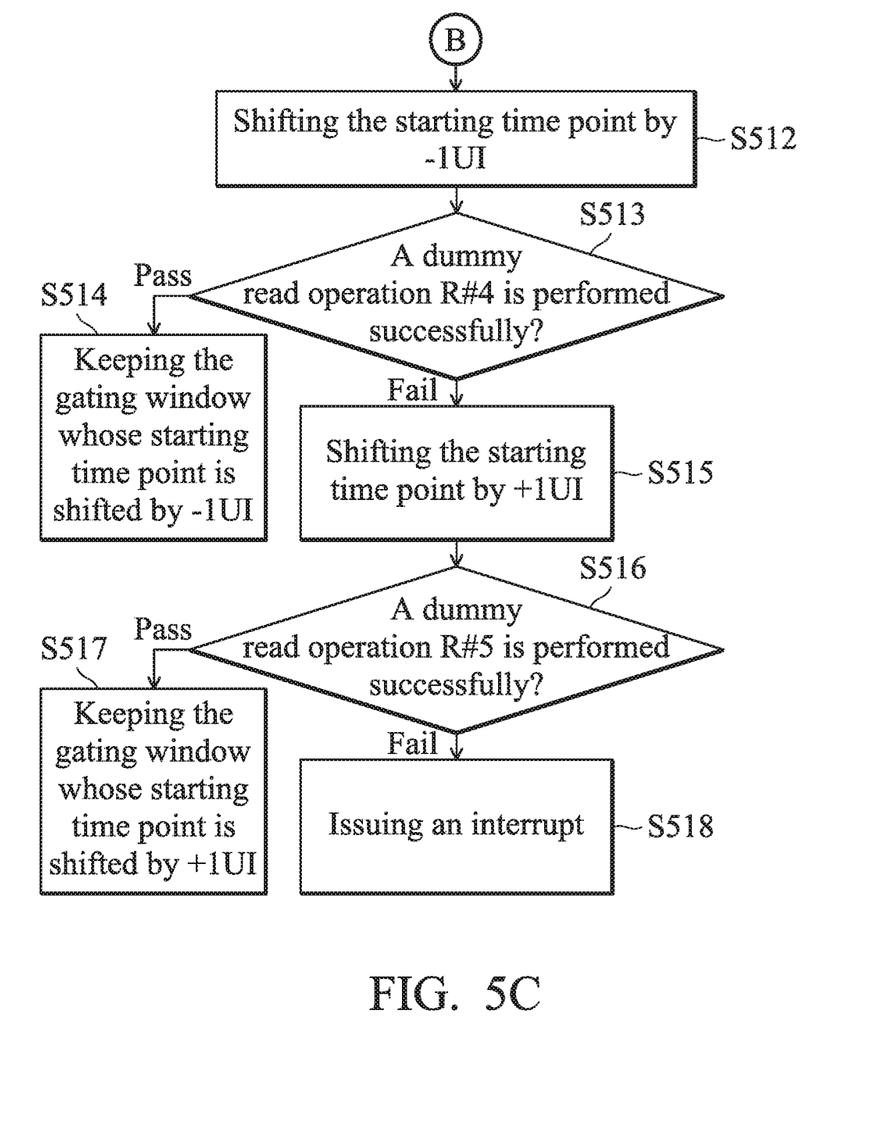

Therefore, a retry operation is provided to compensate for shifting of the data strobe signal DQS which is induced due to the variation of the environment temperature/operation voltage. Referring to FIG. 4, after the memory system 11 exits the suspend mode or frequency scaling mode (Block 21) and before the memory system 1 enters the normal operation mode (Block 22), the memory system 1 is at a retry mode (Block 40) to perform the retry operation to compensate for the shifting of the data strobe signal DQS. FIGS. 5A-5C show a flow chart of an exemplary embodiment of a control method related to the retry operation.

As shown in FIGS. 5A-5C, after a condition is met, the memory controller 10 starts to perform the retry operation (Step S500). The memory controller 10 performs the retry operation until the memory system 1 enters the normal operation mode (Block 22). In an embodiment, when the memory system 1 exits the suspend mode (Block 21 shown in FIG. 2), the condition is met. That is, the retry operation is performed after the memory system 11 exits the suspend mode (Block 21 shown in FIG. 2) and before the memory system 1 enters the normal operation mode (Block 22 shown in FIG. 2). The memory system 1 is at the retry mode (Block 40) to perform the retry operation. In another embodiment, when the operation frequency of the memory system 1 changes from the current frequency to another different frequency (the memory system 1 exits the frequency scaling mode), the condition is met. That is, the retry operation is performed after the frequency scaling mode (Block 21 shown in FIG. 2) and before the memory system 1 enters the normal operation mode (Block 22 shown in FIG. 2). The memory system 1 is at the retry mode (Block 40) to perform the retry operation.

Figure 6:
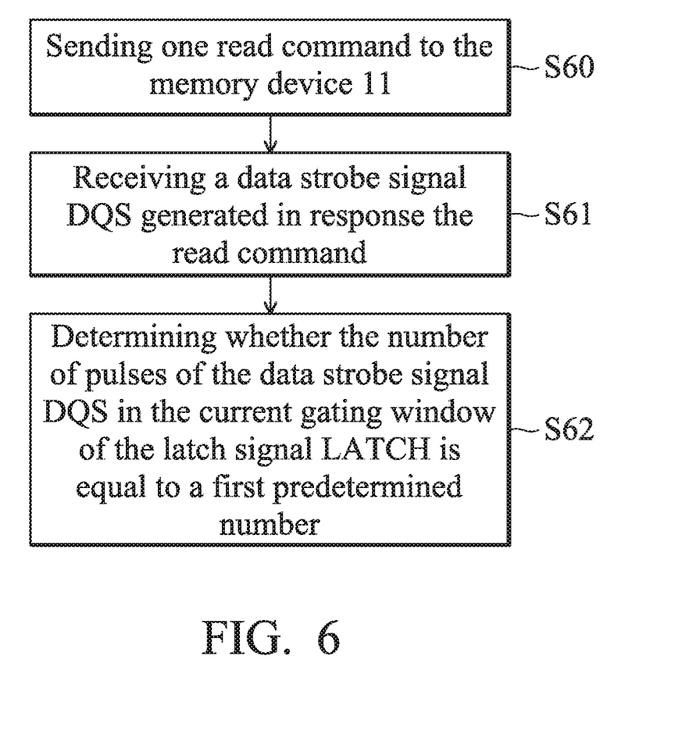
FIG. 6 shows a flow chart of an exemplary embodiment of a dummy read operation.

In the retry operation, the memory controller defines a predetermined gating window GW with an initial starting time point (Step S501). In the embodiment, the gating window GW which is used for the read operation performed by the memory system 1 in the normal operation last time (that is Block 20 shown in FIG. 2) serves as the predetermined gating window. Thus, the starting time point STP30 of the gating window GW serves as the initial starting time point. Then, the memory controller 10 performs a dummy read operation R#1 on the memory device 11 and determines whether the dummy read operation R#1 is successful (Step S502). FIG. 6 shows the detail of the step S502. Referring to FIG. 6, during one dummy read operation, the memory controller 10 sends one read command to the memory device 11 (Step S60). Then, the memory controller 10 waits for response from the memory device 11. When the memory controller 10 receives a data strobe signal DQS which is generated by the memory device 11 in response to the read command (Step S61), the memory controller 10 determines whether the number of pulses of the data strobe signal DQS in the current gating window of the latch signal LATCH (that is the initial gating window with the initial starting time point STP30) is equal to a first predetermined number (Step S62). In the embodiment, the first predetermined number is four. In the embodiment, the memory controller 10 determines whether the number of pulses of the data strobe signal DQS in the current gating window of the latch signal LATCH is equal to four by determining whether the number of rising edges of the data strobe DQS in the current gating window is equal to a second predetermined number (in the embodiment, the second predetermined number is four) and determining whether the number of falling edges of the data strobe DQS in the current gating window is equal to a third predetermined number (in the embodiment, the third predetermined number is four). When the memory controller 10 determines that the number of rising edges of the data strobe signal in the current gating window is not equal to four or that the number of falling edges of the data strobe signal in the current gating window is not equal to four, the memory controller 10 determines that the number of pulses of the data strobe signal in the current gating window is not equal to four.

When the memory controller 10 determines that the number of pulses of the data strobe signal in the current gating window having the initial starting time point is not equal to four in the step S502, the memory controller 10 determines that the dummy read operation R#1 is not successful. Then, the memory controller 10 determines whether the operation speed of the memory system 1 is larger than a speed threshold (Step S503). When the memory controller 10 determines that the operation speed of the memory system 1 is larger than the speed threshold, the memory controller 10 shifts the gating window of the latch signal LATCH by moving a starting time point of the gating window from the initial starting time point STP 30 to a shifted starting time point which occurs prior to the initial starting time point STP30 (Step S504). The time period of one pulse of the data strobe signal DQS is defined as one shifting unit UI. In the step S504, the interval between the moved starting time point and the initial starting time point is two shifting units UI (2UI), that is, the starting time point is shifted by −2UI from the initial starting time point STP30, wherein "−" represents the shifting direction "backward".

Then, the memory controller 10 performs a dummy read operation R#2 on the memory device 11 and determines whether the dummy read operation R#2 is successful (Step S505). The detailed operations of the step S502 are the similar to the operations S60-S62 shown in FIG. 6. In the step S505, the current gating window of the latch signal LATCH for the dummy read operation R#2 is the gating window whose starting time point is shifted by −2UI with respect to the initial starting time point STP30. When the memory controller 10 determines that the number of pulses of the data strobe signal in the current gating window whose starting time point is shifted by −2UI is equal to four in the step S505, the memory controller 10 determines that the dummy read operation R#2 is successful. The memory controller 10 shifts the gating window of the latch signal LATCH by moving the starting time point of the gating window to another shifted starting time point which occurs prior to the initial starting time point STP30 (Step S506), and then the retry operation ends. In the step S506, the interval between the moved starting time point and the initial starting time point is 1.5 shifting units UI (1.5UI), that is, the starting time point is shifted by −1.5UI from the initial starting time point STP30. Accordingly, the starting time point of the gating window shifted by −1.5UI is between the initial starting time point STP30 and the starting time point of the gating window shifted by −2UI. When the memory system 1 enters the normal operation mode (Block 22) and performs a read operation at this normal operation mode, the memory system 1 latches data from the memory device 11 based on the gating window whose starting time point is shifted by −1.5UI. On the contrary, when the memory controller 10 determines that the number of pulses of the data strobe signal in the current gating window whose starting time point is shifted by −2UI is not equal to four in the step S505, the memory controller 10 determines that the dummy read operation R#2 is not successful. The memory controller 10 shifts the gating window of the latch signal LATCH by moving the starting time point of the gating window to another shifted starting time point which occurs after the initial starting time point STP30 (Step S507). In the step S507, the interval between the moved starting time point and the initial starting time point is two shifting units UI (2UI), that is, the starting time point is shifted by +2UI from the initial starting time point STP30, wherein "+" represents the shifting direction "forward". Accordingly, the initial starting time point STP30 is between the starting time point of the gating window shifted by +2UI and the starting time point of the gating window shifted by −2UI.

Then, the memory controller 10 performs a dummy read operation R#3 on the memory device 11 and determines whether the dummy read operation R#3 is successful (Step S508). The detailed operations of the step S508 are similar to the operations S60-S62 shown in FIG. 6. In the step S508, the current gating window of the latch signal LATCH for the dummy read operation R#3 is the gating window whose starting time point is shifted by +2UI. When the memory controller 10 determines that the number of pulses of the data strobe signal in the current gating window whose starting time point is shifted by +2UI is equal to four in the step S508, the memory controller 10 determines that the dummy read operation R#3 is successful. The memory controller 10 shifts the gating window of the latch signal LATCH by moving the starting time point of the gating window to another shifted starting time point which occurs after the initial starting time point STP30 (Step S509), and then the retry operation ends. In the step S509, the interval between the moved starting time point and the initial starting time point is 1.5 shifting units UI (1.5UI), that is, the starting time point is shifted by +1.5UI from the initial starting time point STP30. Accordingly, the starting time point of the gating window shifted by +1.5UI is between the initial starting time point STP30 and the starting time point of the gating window shifted by +2UI. When the memory system 1 enters the normal operation mode (Block 22) and performs a read operation at this normal operation mode, the memory system 1 latches data from the memory device 11 based on the gating window whose starting time point is shifted by +1.5UI. However, when the memory controller 10 determines that the number of pulses of the data strobe signal in the current gating window whose starting time point is shifted by +2UI is not equal to four in the step S508, the memory controller 10 determines that the dummy read operation R#3 is not successful. Then, the memory controller 10 determines whether the retry operation will end according to the design and requirements of the memory system 1 (Step S510). When the memory controller 10 determines that the retry operation will end, the memory controller 10 issues an interrupt to indicate that the compensation for shifting of the data strobe signal DQS is unsuccessful (Step S511) and the retry operation ends.

Figure 3C:
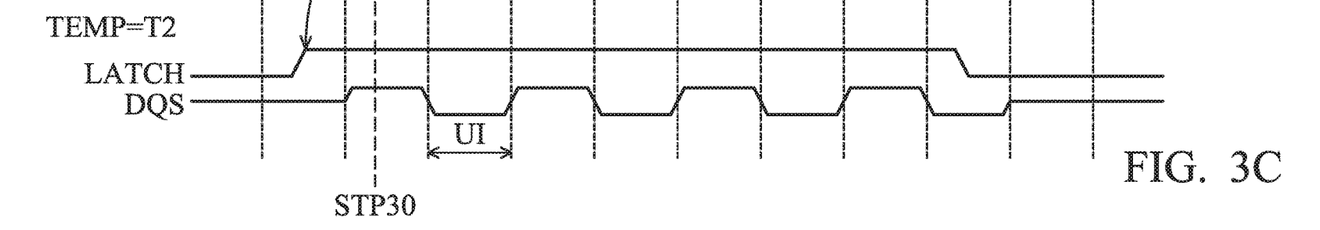
FIG. 3C is diagrams showing a data strobe signal which is shifted due to environment temperature variation and a latch signal whose gating window is shifted by a retry operation according to an exemplary embodiment.

When the memory controller 10 determines that the retry operation will not end, the memory controller 10 shifts the gating window of the latch signal LATCH by moving the starting time point of the gating window to another shifted starting time point which occurs prior to the initial starting time point STP30 (Step S512). In the step S512, the interval between the moved starting time point and the initial starting time point is one shifting unit UI, that is, the starting time point is shifted by −1UI from the initial starting time point STP30, as shown in FIG. 3C. Accordingly, the starting time point of the gating window shifted by −1UI is between the initial starting time point STP30 and the starting time point of the gating window shifted by −2UI.

The memory controller 10 performs a dummy read operation R#4 on the memory device 11 and determines whether the dummy read operation R#4 is successful (Step S513). The detailed operations of the step S513 are the similar to the operations S60-S62 shown in FIG. 6. In the step S513, the current gating window of the latch signal LATCH for the dummy read operation R#4 is the gating window whose starting time point is shifted by −1UI. When the memory controller 10 determines that the number of pulses of the data strobe signal in the current gating window whose starting time point is shifted by −1UI is equal to four in the step S513, the memory controller 10 determines that the dummy read operation R#4 is successful, as shown in FIG. 3C. The memory controller 10 then keeps the gating window whose starting time point is shifted by −1UI (Step S514), and then the retry operation ends. When the memory system 1 enters the normal operation mode (Block 22) and performs a read operation at this normal operation mode, the memory system 1 latches data from the memory device 11 based on the gating window whose starting time point is shifted by −1UI. On the contrary, when the memory controller 10 determines that the number of pulses of the data strobe signal in the current gating window whose starting time point is shifted by −1UI is not equal to four in the step S513, the memory controller 10 determines that the dummy read operation R#4 fails. The memory controller 10 shifts the gating window of the latch signal LATCH by moving the starting time point of the gating window to another shifted starting time point which occurs after the initial starting time point STP30 (Step S515). In the step S515, the interval between the moved starting time point and the initial starting time point is one shifting unit UI, that is, the starting time point is shifted by +1UI from the initial starting time point STP30. Accordingly, the initial starting time point STP30 is between the starting time point of the gating window shifted by +1UI and the starting time point of the gating window shifted by −1UI.

Then, the memory controller 10 performs a dummy read operation R#5 on the memory device 11 and determines whether the dummy read operation R#5 is successful (Step S516). The detailed operations of the step S516 are the similar to the operations S60-S62 shown in FIG. 6. In the step S516, the current gating window of the latch signal LATCH for the dummy read operation R#5 is the gating window whose starting time point is shifted by +1UI. When the memory controller 10 determines that the number of pulses of the data strobe signal in the current gating window whose starting time point is shifted by +1UI is equal to four in the step S516, the memory controller 10 determines that the dummy read operation R#5 is successful. The memory controller 10 then keeps the gating window whose starting time point is shifted by +1UI (Step S517), and then the retry operation ends. When the memory system 1 enters the normal operation mode (Block 22) and performs a read operation at this normal operation mode, the memory system 1 latches data from the memory device 11 based on the gating window whose starting time point is shifted by +1UI. However, when the memory controller 10 determines that the number of pulses of the data strobe signal in the current gating window whose starting time point is shifted by +1UI is not equal to four in the step S516, the memory controller 10 determines that the dummy read operation R#5 is not successful. the memory controller 10 issues an interrupt to indicate that the compensation for shifting of the data strobe signal DQS is unsuccessful (Step S518) and the retry operation ends.

When the memory controller 10 determines that the operation speed of the memory system 1 is not larger than the speed threshold in the step S503, the control method proceeds directly to the step S512. According to the embodiment, in the case where the dummy read operation R#1 in the step S502 is not successful, the total number of times of performing a dummy read operation by the memory system 1 with a larger speed operation is more than the total number of times of performing a dummy read operation by the memory system 1 with a less speed operation (5>3).

In the above embodiment, the retry operation ending at one of the steps S506, S509, S514, and S517 means that the compensation for the shifting of the data strobe signal DQS is completed by shifting the gating window. Thus, there are four pulses of the data strobe signal DQS in the gating window, as shown in FIG. 3C. When the memory system 1 performs a read operation at this normal operation mode (Block 22), the memory controller 10 can read the data from the memory device 11 correctly based on the gating window with the shifted gating window.

When the memory controller 10 determines that the number of pulses of the data strobe signal in the current gating window having the initial starting time point is equal to four in the step S502, the memory controller 10 determines that the dummy read operation R#1 is successful. Then, the memory controller 10 determines whether the retry operation ends according to the design and requirements of the memory system 1 (Step S519). When the memory controller 10 determines that the retry operation will end, the memory controller 10 keeps the initial starting time point STP30, which represented by +0UI, and then the retry operation ends (Step S520). When the memory system 1 enters the normal operation mode (Block 22) and performs a read operation at this normal operation mode, the memory system 1 latches data from the memory device 11 based on the gating window with the initial starting time point STP30. In an embodiment, when the memory system 1 requires shorter wake-up time, it is determined that the retry operation will end in the step S519, that is, only one dummy read operation (the dummy read operation R#3) is performed.

When the memory controller 10 determines that the retry operation will not end, the memory controller 10 shifts the gating window of the latch signal LATCH by moving the starting time point of the gating window to another shifted starting time point which occurs prior to the initial starting time point STP30 (Step S521). In the step S521, the interval between the moved starting time point and the initial starting time point is one shifting unit UI, that is, the starting time point is shifted by −1UI from the initial starting time point STP30. As described above, there is successful dummy read operation R#1, which means that the shifting of the data strobe signal DQS is less or the data strobe signal DQS is not shifted. Thus, in the embodiment, due to the occurrence of the successful dummy read operation R#1, the shifting of the starting time point of the gating window in the step S521 is less than that in the step S504. In the case where the retry operation still continues, the shifting of the starting time point of the gating window is less. In the embodiment, the shifting value (1UI) in the step S521 is less than the shifting value (2UI) in the step S504 (1UI<2UI).

The memory controller 10 performs a dummy read operation R#2' on the memory device 11 and determines whether the dummy read operation R#2' is successful (Step S522). The detailed operations of the step S522 are the similar to the operations S60-S62 shown in FIG. 6. In the step S522, the current gating window of the latch signal LATCH for the dummy read operation R#2' is the gating window whose starting time point is shifted by −1UI. When the memory controller 10 determines that the number of pulses of the data strobe signal in the current gating window whose starting time point is shifted by −1UI is equal to four in the step S522, the memory controller 10 determines that the dummy read operation R#2' is successful, as shown in FIG. 3C. The memory controller 10 shifts the gating window of the latch signal LATCH by moving the starting time point of the gating window to another shifted starting time point which occurs prior to the initial starting time point STP30 (Step S523), and then the retry operation ends. In the step S523, the interval between the moved starting time point and the initial starting time point is 0.5 shifting unit UI (0.5UI), that is, the starting time point is shifted by −0.5UI from the initial starting time point STP30. Accordingly, the starting time point of the gating window shifted by −0.5UI is between the initial starting time point STP30 and the starting time point of the gating window shifted by −1UI. When the memory system 1 enters the normal operation mode (Block 22) and performs a read operation at this normal operation mode, the memory system 1 latches data from the memory device 11 based on the gating window whose starting time point is shifted by −0.5UI. However, when the memory controller 10 determines that the number of pulses of the data strobe signal in the current gating window whose starting time point is shifted by −1UI is not equal to four in the step S522, the memory controller 10 determines that the dummy read operation R#2' is not successful. The memory controller 10 shifts the gating window of the latch signal LATCH by moving the starting time point of the gating window to another shifted starting time point which occurs after the initial starting time point STP30 (Step S524). In the step S524, the interval between the moved starting time point and the initial starting time point is one shifting unit UI, that is, the starting time point is shifted by +1UI from the initial starting time point STP30. Accordingly, the initial starting time point STP30 is between the starting time point of the gating window shifted by +1UI and the starting time point of the gating window shifted by −1UI.

Then, the memory controller 10 performs a dummy read operation R#3' on the memory device 11 and determines whether the dummy read operation R#3' is successful (Step S525). The detailed operations of the step S525 are the similar to the operations S60-S62 shown in FIG. 6. In the step S525, the current gating window of the latch signal LATCH for the dummy read operation R#3' is the gating window whose starting time point is shifted by +1UI. When the memory controller 10 determines that the number of pulses of the data strobe signal in the current gating window whose starting time point is shifted by +1UI is equal to four in the step S525, the memory controller 10 determines that the dummy read operation R#3' is successful. The memory controller 10 then shifts the gating window of the latch signal LATCH by moving the starting time point of the gating window to another shifted starting time point which occurs after the initial starting time point STP30 (Step S526), and then the retry operation ends. In the step S526, the interval between the moved starting time point and the initial starting time point is 0.5 shifting unit UI (0.5UI), that is, the starting time point is shifted by +0.5UI from the initial starting time point STP30. Accordingly, the starting time point of the gating window shifted by +0.5UI is between the initial starting time point STP30 and the starting time point of the gating window shifted by +1UI. When the memory system 1 enters the normal operation mode (Block 22) and performs a read operation at this normal operation mode, the memory system 1 latches data from the memory device 11 based on the gating window whose starting time point is shifted by +0.5UI. On the contrary, when the memory controller 10 determines that the number of pulses of the data strobe signal in the current gating window whose starting time point is shifted by +1UI is not equal to four in the step S516, the memory controller 10 determines that the dummy read operation R#3' is not successful. The memory controller 10 then shifts the gating window of the latch signal LATCH by moving the starting time point of the gating window to the initial starting time point STP30, which represented by +0UI (Step S527), and then the retry operation ends. When the memory system 1 enters the normal operation mode (Block 22) and performs a read operation at this normal operation mode, the memory system 1 latches data from the memory device 11 based on the gating window with the initial starting time point STP30.

As described above, when the memory controller 10 determines that the dummy read operation R#1 is successful in the step S502, the control method proceeds to the step S519. Thus, the following steps S521-S527 are performed for finely shifting the gating window to ensure that the data from the memory device 11 can be read more correctly during any read operation at the normal operation mode.

Figure 7A:
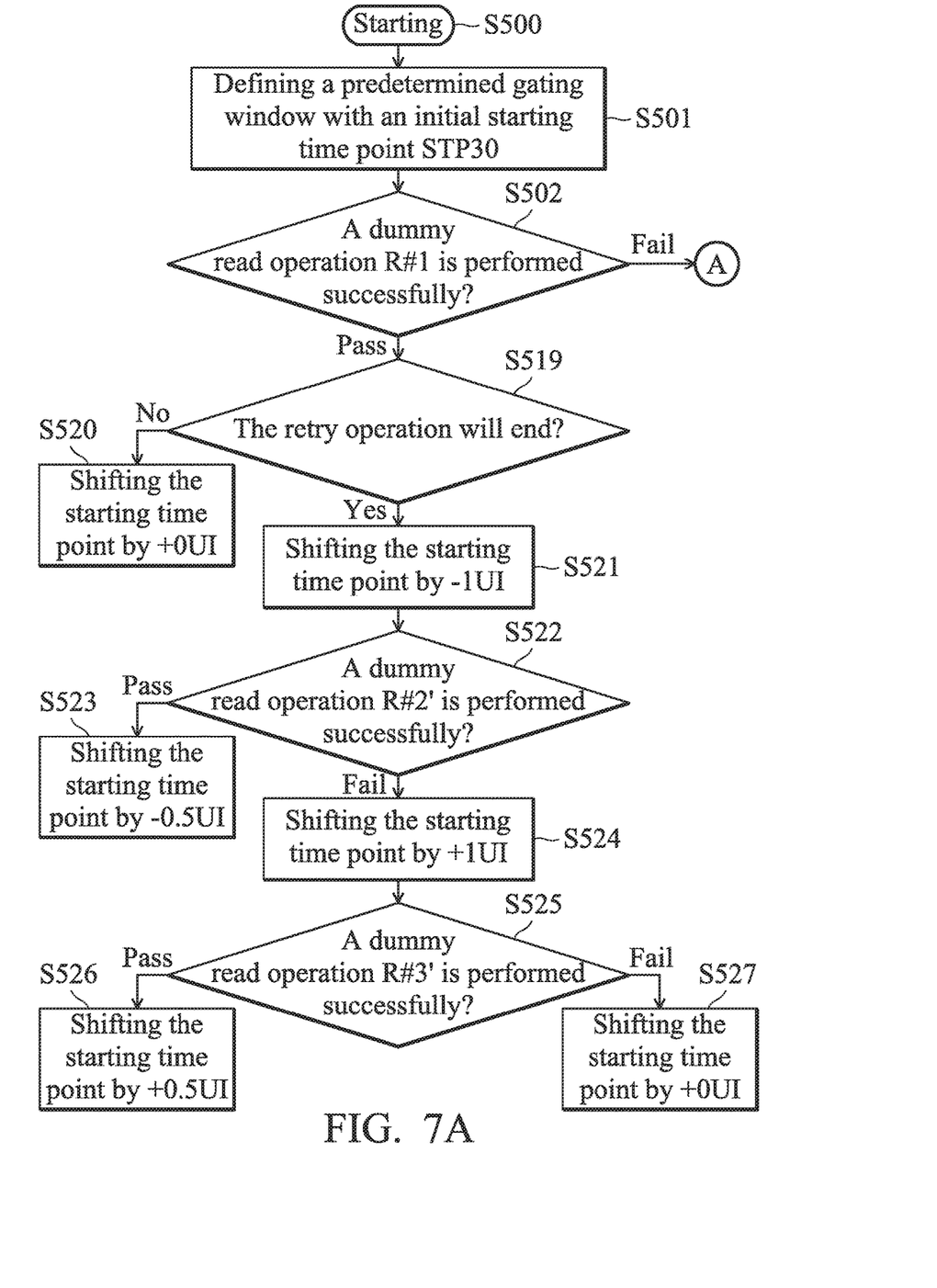
FIGS. 7A-7C show a flow chart of another exemplary embodiment of a control method for a memory system.
Figure 7B:
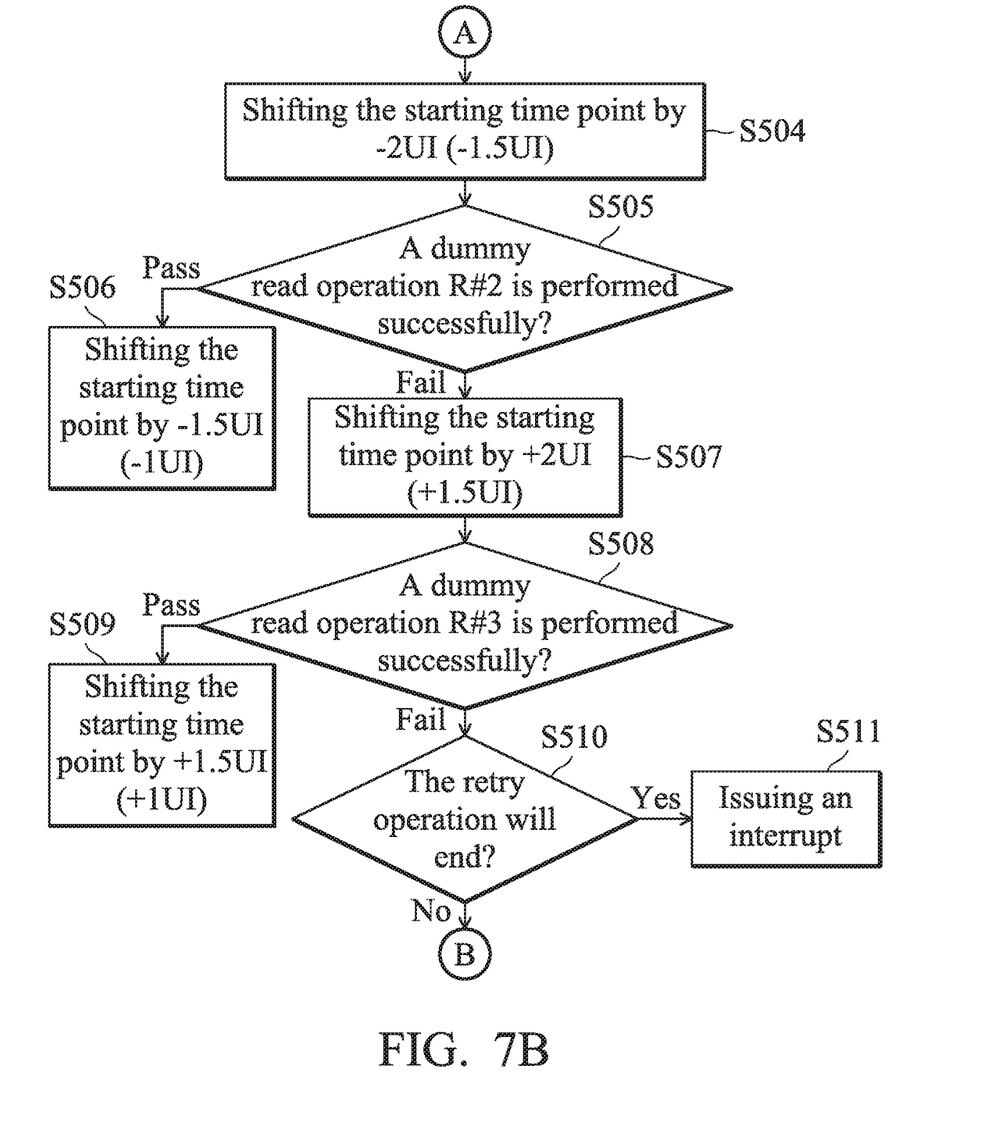
Figure 7C:
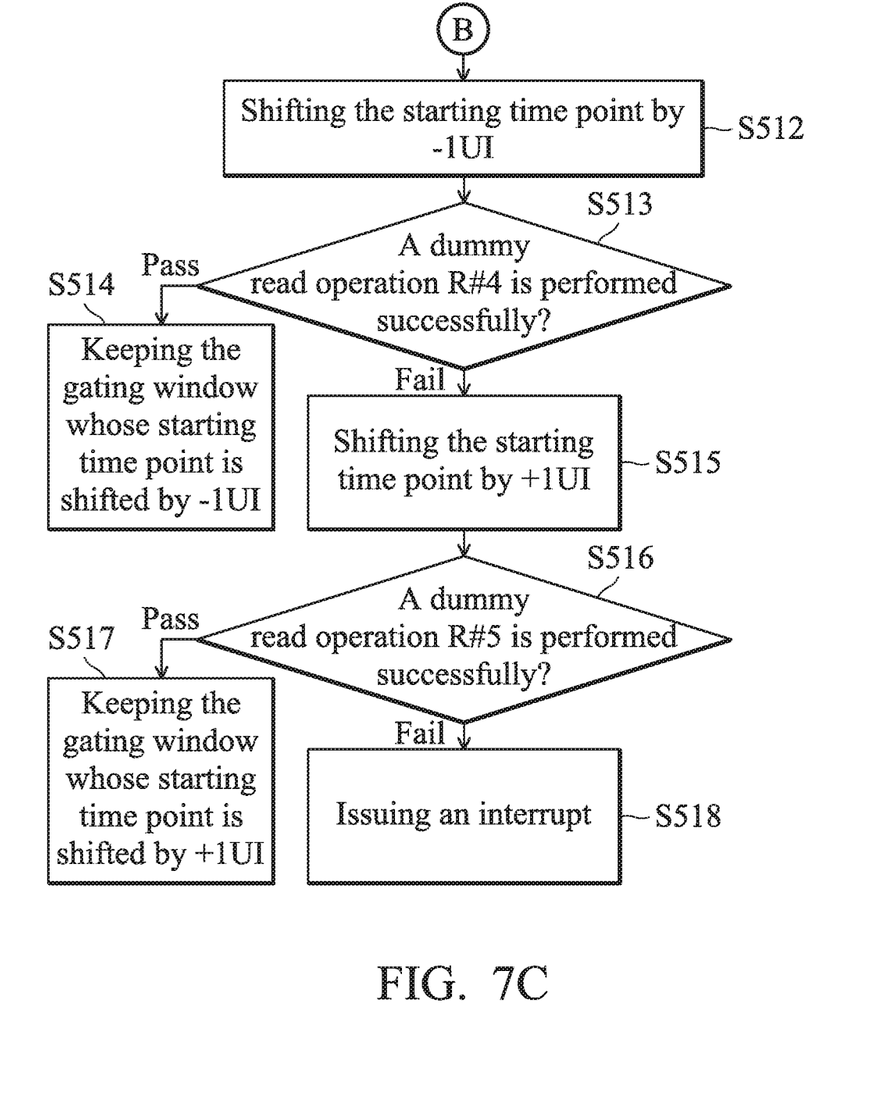

In an embodiment, the step S503 is not included in the control method. After the step S502, the control method proceeds directly to the step S504 to shift the starting time point of the gating window by −2UI, as shown in FIG. 7B. In this case, the basis for determining whether the retry operation will end is the operation speed of the memory system 1. When memory controller 10 determines that the operation speed of the memory system 1 is not larger than a speed threshold, the memory controller 10 determines that the retry operation will end. Then, the control method proceeds to the step S511, and the retry operation ends. When memory controller 10 determines that the operation speed of the memory system 1 is larger than a speed threshold, the memory controller 10 determines that the retry operation will not end. Then, the control method proceeds to the step S512 to perform the following dummy read operation.

In an embodiment, the shifting of the starting time point in the step S504, S506, S507, and S509 of the control method performed by the memory system 1 is determined according to the tolerance of the environment temperature or operation voltage variation. In detail, the shifting of the starting time point in the step S504, S506, S507, and S509 of the control method performed by the memory system 1 which has higher tolerance of the environment temperature or operation voltage variation is larger than that performed by the memory system 1 which has lower tolerance of the environment temperature or operation voltage variation. For example, in the embodiment of FIG. 2, the shifting values of the starting time point in the step S504, S506, S507, and S509 are −2UI, −1.5UI, +2UI, and +1.5UI, respectively, for the memory system whose maximum tolerance of the environment temperature variation is 100° C. In another embodiment, the shifting values of the starting time point in the step S504, S506, S507, and S509 are −1.5UI, −1UI, +1.5UI, and +1UI, respectively, for the memory system whose maximum tolerance of the environment temperature variation is less than 70° C.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A control method for a memory system, comprising:
after a condition is met, performing a retry operation until the memory system enters a normal operation mode;
wherein the retry operation comprises:
defining a predetermined gating window having an initial starting time point;
performing a first dummy read operation on a memory device of the memory system by sending at least one first read command to the memory device and gener- ating a data strobe signal by the memory device in response to the at least one first read command;

determining whether a number of pulses of the data strobe signal in the gating window having the initial starting time point is equal to a first predetermined number; and when it is determined that the number of pulses of the data strobe signal in the gating window having the initial starting time point is not equal to the first predetermined number, shifting the gating window by moving a starting time point of the gating window from the initial starting time point to a first shifted starting time point.

2. The control method as claimed in claim 1, wherein when the memory system exists a suspend mode, the condition is met.

3. The control method as claimed in claim 1, wherein when an operation frequency of the memory system changes from a first frequency to a second frequency, which is different from the first frequency, the condition is met.

4. The control method as claimed in claim 1, wherein the predetermined gating window having the initial starting time point is a gating window which is used for a read operation performed when the memory system is at the normal operation mode last time.

5. The control method as claimed in claim 1, wherein the predetermined gating window has a fixed time length.

6. The control method as claimed in claim 1, wherein the step of determining whether the number of pulses of the data strobe signal in the gating window is equal to the first predetermined number:

determining whether a number of rising edges of the data strobe signal in the gating window is equal to a second predetermined number; and determining whether a number of falling edges of the data strobe signal in the gating window is equal to a third predetermined number, wherein when the number of rising edges of the data strobe signal in the gating window is not equal to the second predetermined number or when the number of falling edges of the data strobe signal in the gating window is not equal to the third predetermined number, it is determined that the number of pulses of the data strobe signal in the gating window is not equal to the first predetermined number.

7. The control method as claimed in claim 1, wherein the retry operation further comprises:

performing a second dummy read operation on the memory device by sending at least one second read command to the memory device and generating the data strobe signal by the memory device in response to the at least one second read command;

determining whether the number of pulses of the data strobe signal in the gating window having the first shifted starting time point is equal to the first predetermined number; and when it is determined that the number of pulses of the data strobe signal in the gating window having the first shifted starting time point is not equal to the first predetermined number, shifting the gating window by moving the starting time point of the gating window to a second shifted starting time point, wherein the initial starting time point is between the first shifted starting time point and the second shifted starting time point.

8. The control method as claimed in claim 7, wherein the retry operation further comprises:

when it is determined that the number of pulses of the data strobe signal in the gating window having the first shifted starting time point is equal to the first predetermined number, shifting the gating window by moving the starting time point of the gating window to a third shifted starting time point, wherein the third shifted starting time point is between the initial starting time point and the first shifted starting time point, and wherein when the memory system enters the normal operation mode and performs a read operation at the normal operation mode, the memory system latches data from the memory device based on the gating window which starts at the third shifted starting time point.

9. The control method as claimed in claim 7, wherein the retry operation further comprises:

performing a third dummy read operation on the memory device by sending at least one third read command to the memory device and generating the data strobe signal by the memory device in response to the at least one third read command;

determining whether the number of pulses of the data strobe signal in the gating window having the second shifted starting time is equal to the first predetermined number;

when it is determined that the number of pulses of the data strobe signal in the gating window having the second shifted starting time is not equal to the first predetermined number, determining whether the retry operation ends; and when it is determined that the retry operation does not end, shifting the gating window by moving the starting time point of the gating window to a third shifted starting time point, wherein the third shifted starting time point is between the initial shifted starting time point and the first shifted starting time point.

10. The control method as claimed in claim 9, wherein the retry operation further comprises:

when it is determined that the retry operation ends, issuing an interrupt to indicate that compensation for shifting of the data strobe signal is unsuccessful.

11. The control method as claimed in claim 10, wherein when an operation speed of the memory system is larger than a speed threshold, it is determined that the retry operation does not end, and wherein when the operation speed of the memory system is not larger than the speed threshold, it is determined that the retry operation ends.

12. The control method as claimed in claim 9, wherein the retry operation further comprises:

when it is determined that the number of pulses of the data strobe signal in the gating window having the second shifted starting time point is equal to the first predetermined number, shifting the gating window by moving the starting time point of the gating window to a fourth shifted starting time point, wherein the fourth shifted starting time point is between the initial starting time point and the second shifted starting time point, and wherein when the memory system enters the normal operation mode and performs a read operation at the normal operation mode, the memory system latches data from the memory device based on the gating window which starts at the fourth shifted starting time point.

13. The control method as claimed in claim 9, wherein the retry operation further comprises:
- performing a fourth dummy read operation on the memory device by sending at least one fourth read command to the memory device and generating the data strobe signal by the memory device in response to the at least one fourth read command;
- determining whether the number of pulses of the data strobe signal in the gating window having the third shifted starting time point is equal to the first predetermined number; and
- when it is determined that the number of pulses of the data strobe signal in the gating window having the third shifted starting time point is not equal to the first predetermined number, shifting the gating window by moving the starting time point of the gating window to a fourth shifted starting time point,
- wherein the initial starting time point is between the third shifted starting time point and the fourth shifted starting time point.

14. The control method as claimed in claim 13, wherein the retry operation further comprises:
- when it is determined that the number of pulses of the data strobe signal in the gating window having the third shifted starting time point is equal to the first predetermined number, keeping the gating window at the third shifted starting time point,
- wherein when the memory system enters the normal operation mode and performs a read operation at the normal operation mode, the memory system latches data from the memory device based on the gating window which starts at the third shifted starting time point.

15. The control method as claimed in claim 13, wherein the retry operation further comprises:
- performing a fifth dummy read operation on the memory device by sending at least one fifth read command to the memory device and generating the data strobe signal by the memory device in response to the at least one fifth read command;
- determining whether the number of pulses of the data strobe signal in the gating window having the fourth shifted starting time is equal to the first predetermined number; and
- when it is determined that the number of pulses of the data strobe signal in the gating window having the fourth shifted starting time is not equal to the first predetermined number, issuing an interrupt to indicate that compensation for shifting of the data strobe signal is unsuccessful.

16. The control method as claimed in claim 15, wherein the retry operation further comprises:
- when it is determined that the number of pulses of the data strobe signal in the gating window having the fourth shifted starting time point is equal to the first predetermined number, keeping the gating window at the fourth shifted starting time point,
- wherein when the memory system enters the normal operation mode and performs a read operation at the normal operation mode, the memory system latches data from the memory device based on the gating window which starts at the fifth shifted starting time point.

17. The control method as claimed in claim 1, wherein the retry operation further comprises:
- when it is determined that the number of pulses of the data strobe signal in the gating window having the initial starting time point is equal to the first predetermined number, determining whether the retry operation ends; and
- when it is determined that the retry operation does not end, shifting the gating window by moving the starting time point of the gating window to a second starting time point,
- wherein the second shifted starting time point is between the initial shifted starting time point and the first shifted starting time point.

18. The control method as claimed in claim 17, wherein the retry operation further comprises:
- when it is determined that the retry operation ends, keeping the gating window at the initial starting time point,
- wherein when the memory system enters the normal operation mode and performs a read operation at the normal operation mode, the memory system latches data from the memory device based on the gating window which starts at the initial starting time point.

19. The control method as claimed in claim 17, wherein the retry operation further comprises:
- performing a second dummy read operation on the memory device by sending at least one second read command to the memory device and generating the data strobe signal by the memory device in response to the at least one second read command;
- determining whether the number of pulses of the data strobe signal in the gating window having the second shifted starting time point is equal to the first predetermined number; and
- when it is determined that the number of pulses of the data strobe signal in the gating window having the second shifted starting time point is not equal to the first predetermined number, shifting the gating window by moving the starting time point of the gating window to a third shifted starting time point,
- wherein the initial starting time point is between the second shifted starting time point and the third shifted starting time point.

20. The control method as claimed in claim 19, wherein the retry operation further comprises:
- when it is determined that the number of pulses of the data strobe signal in the gating window having the second shifted starting time point is equal to the first predetermined number, shifting the gating window by moving the starting time point of the gating window to a fourth shifted starting time point,
- wherein the fourth starting time point is between the initial starting time point and the second shifted starting time point, and
- wherein when the memory system enters the normal operation mode and performs a read operation at the normal operation mode, the memory system latches data from the memory device based on the gating window which starts at the fourth shifted starting time point.

21. The control method as claimed in claim 19, wherein the retry operation further comprises:
- performing a third dummy read operation on the memory device by sending at least one third read command to the memory device and generating the data strobe signal by the memory device in response to the at least one third read command;

determining whether the number of pulses of the data strobe signal in the gating window having the third shifted starting time is equal to the first predetermined number; and when it is determined that the number of pulses of the data strobe signal in the gating window having the third shifted starting time is not equal to the first predetermined number, shifting the gating window by moving the starting time point of the gating window to the initial starting time point, wherein when the memory system enters the normal operation mode and performs a read operation at the normal operation mode, the memory system latches data from the memory device based on the gating window which starts at the initial starting time point.

22. The control method as claimed in claim 21, wherein the retry operation further comprises:

when it is determined that the number of pulses of the data strobe signal in the gating window having the third shifted starting time point is equal to the first predetermined number, shifting the gating window by moving the starting time point of the gating window to a fourth shifted starting time point, wherein the fourth starting time point is between the initial starting time point and the third shifted starting time point, and wherein when the memory system enters the normal operation mode and performs the read operation at the normal operation mode, the memory system latches data from the memory device based on the gating window which starts at the fourth shifted starting time point.

23. A memory system comprising:

a memory device; and a memory controller coupled to the memory device and configured to control the memory device, wherein after a condition is met, the memory controller performs a retry operation to compensate for shifting of a data strobe signal sent from the memory device until the memory system enters a normal operation mode.

24. The memory system as claimed in claim 23, wherein when the memory system exists a suspend mode, the condition is met.

25. The memory system as claimed in claim 23, wherein when an operation frequency of the memory system changes from a first frequency to a second frequency, which is different from the first frequency, the condition is met.

26. The memory system as claimed in claim 23, wherein during the retry operation, the memory controller performs at least one dummy read operation to the memory device, receives the data strobe signal send from the memory device in response to the at least one dummy read operation, determines whether a number of pulses of the data strobe signal in a gating window used to latch data from the memory device is equal to a first predetermined number, and shifts a starting time point of the gating window of the signal latch signal according to the determination result.

27. The memory system as claimed in claim 26, wherein when the shifting of the data strobe signal is compensated for, the number of pulses of the data strobe signal in the gating window is equal to the first predetermined number.

28. The memory system as claimed in claim 27, wherein the memory control determines whether a number of rising edges of the data strobe signal in the gating window is equal to a second predetermined number and whether a number of falling edges of the data strobe signal in the gating window is equal to a third predetermined number to the determine whether the number of pulses of the data strobe signal in the gating window is equal to the first predetermined number, and wherein when the memory controller determines that the number of rising edges of the data strobe signal in the gating window is not equal to the second predetermined number or that the number of falling edges of the data strobe signal in the gating window is not equal to the third predetermined number, it is determined that the number of pulses of the data strobe signal in the gating window is not equal to the first predetermined number.

29. The memory system as claimed in claim 26, wherein when the memory system enters the normal operation mode and performs read operations at the normal operation mode, the memory system latches data from the memory device based on the gating window with the shifted starting time point.

* * * * *